(12) United States Patent
Ghyselen et al.

(10) Patent No.: US 7,407,869 B2
(45) Date of Patent: **\*Aug. 5, 2008**

(54) METHOD FOR MANUFACTURING A FREE-STANDING SUBSTRATE MADE OF MONOCRYSTALLINE SEMICONDUCTOR MATERIAL

(75) Inventors: Bruno Ghyselen, Seyssinet-Pariset (FR); Fabrice Letertre, Grenoble (FR); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 367 days.

This patent is subject to a terminal disclaimer.

(21) Appl. No.: 11/212,795

(22) Filed: Aug. 29, 2005

(65) Prior Publication Data

US 2006/0035440 A1 Feb. 16, 2006

Related U.S. Application Data

(60) Continuation-in-part of application No. 10/349,295, filed on Jan. 22, 2003, now Pat. No. 6,964,914, and a continuation-in-part of application No. 11/009,138, filed on Dec. 13, 2004, now Pat. No. 7,071,029, which is a division of application No. 10/446,604, filed on May 27, 2003, now Pat. No. 6,867,067, which is a continuation of application No. PCT/FR01/03715, filed on Nov. 26, 2001.

(30) Foreign Application Priority Data

Nov. 27, 2000 (FR) .................................. 00 15280
Jan. 22, 2002 (FR) .................................. 02 00762

(51) Int. Cl.
*H01L 21/365* (2006.01)

(52) U.S. Cl. ........................ 438/458; 438/483; 438/509; 257/E21.101

(58) Field of Classification Search ................. 438/458, 438/483, 514; 117/89
See application file for complete search history.

(56) References Cited

U.S. PATENT DOCUMENTS 4,983,251 A 1/1991 Haisma et al. ............... 156/630

(Continued)

FOREIGN PATENT DOCUMENTS

EP 0 546 752 A1 6/1993

(Continued)

*Primary Examiner*—Stephen W Smoot
(74) *Attorney, Agent, or Firm*—Winston & Strawn LLP

(57) ABSTRACT

A method for manufacturing a free-standing substrate made of a semiconductor material. A first assembly is provided and it includes a relatively thinner nucleation layer of a first material, a support of a second material, and a removable bonding interface defined between facing surfaces of the nucleation layer and support. A substrate of a relatively thicker layer of a third material is grown, by epitaph on the nucleation layer, to form a second assembly with the substrate attaining a sufficient thickness to be free-standing. The third material is preferably a monocrystalline material. Also, the removable character of the bonding interface is preserved with at least the substrate being heated to an epitaxial growth temperature. The coefficients of thermal expansion of the second and third materials are selected to be different from each other by a thermal expansion differential, determined as a function of the epitaxial growth temperature or subsequent application of external mechanical stresses, such that, as the second assembly cools from the epitaxial growth temperature, stresses are induced in the removable bonding interface to facilitate detachment of the nucleation layer from the substrate.

22 Claims, 3 Drawing Sheets

U.S. PATENT DOCUMENTS

| | | | |
|---|---|---|---|
| 5,374,564 A | 12/1994 | Bruel | 437/24 |
| 5,478,513 A | 12/1995 | Kosky et al. | 264/81 |
| 5,494,835 A | 2/1996 | Bruel | 437/24 |
| 5,919,305 A | 7/1999 | Solomon | 117/90 |
| 6,010,579 A | 1/2000 | Henley et al. | 148/33.2 |
| 6,100,166 A | 8/2000 | Sakaguchi et al. | 438/455 |
| 6,107,213 A | 8/2000 | Tayanaka et al. | 438/762 |
| 6,114,188 A | 9/2000 | Oliver et al. | 438/107 |
| 6,146,457 A | 11/2000 | Solomon | 117/90 |
| 6,146,979 A | 11/2000 | Henley et al. | 438/458 |
| 6,176,925 B1 * | 1/2001 | Solomon et al. | 117/89 |
| 6,214,701 B1 | 4/2001 | Matsushita et al. | 438/458 |
| 6,218,280 B1 | 4/2001 | Kryliouk et al. | 438/607 |
| 6,245,161 B1 | 6/2001 | Henley et al. | 148/33.4 |
| 6,251,754 B1 | 6/2001 | Ohshima et al. | 438/506 |
| 6,274,518 B1 | 8/2001 | Yuri et al. | 438/791 |
| 6,291,313 B1 * | 9/2001 | Henley et al. | 438/458 |
| 6,303,405 B1 | 10/2001 | Yoshida et al. | 438/46 |
| 6,326,279 B1 | 12/2001 | Kakizaki et al. | 438/406 |
| 6,335,263 B1 | 1/2002 | Cheung et al. | 438/455 |
| 6,420,242 B1 | 7/2002 | Cheung et al. | 438/458 |
| 6,498,113 B1 | 12/2002 | Solomon et al. | 438/778 |
| 6,521,511 B1 | 2/2003 | Inoue et al. | 438/458 |
| 6,653,205 B2 | 11/2003 | Yanagita et al. | 438/455 |
| 6,794,276 B2 | 9/2004 | Letertre et al. | 438/506 |
| 6,867,067 B2 * | 3/2005 | Ghyselen et al. | 438/107 |
| 6,964,914 B2 * | 11/2005 | Ghyselen et al. | 438/458 |
| 2001/0006845 A1 | 7/2001 | Kryliouk | 438/607 |
| 2001/0022154 A1 | 9/2001 | Cho et al. | 117/2 |
| 2002/0019118 A1 | 2/2002 | Chan | 438/514 |
| 2002/0096674 A1 | 7/2002 | Cho et al. | 257/22 |
| 2002/0182889 A1 | 12/2002 | Solomon et al. | 438/778 |
| 2004/0029359 A1 | 2/2004 | Letertre et al. | 438/458 |
| 2004/0187766 A1 | 9/2004 | Letertre et al. | 438/506 |

FOREIGN PATENT DOCUMENTS

| | | |
|---|---|---|
| EP | 0 528 229 A3 | 6/2000 |
| EP | 1 045 431 A1 | 10/2000 |
| FR | 2 787 919 A1 | 6/2000 |
| FR | 2 817 394 A1 | 5/2002 |
| WO | WO 99/01593 | 1/1999 |
| WO | WO 99/01899 A1 | 1/1999 |
| WO | WO 99/471776 A1 | 8/1999 |
| WO | WO 02/43112 A2 | 5/2002 |

* cited by examiner

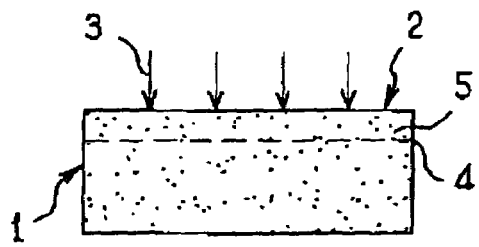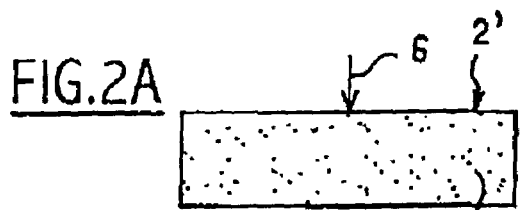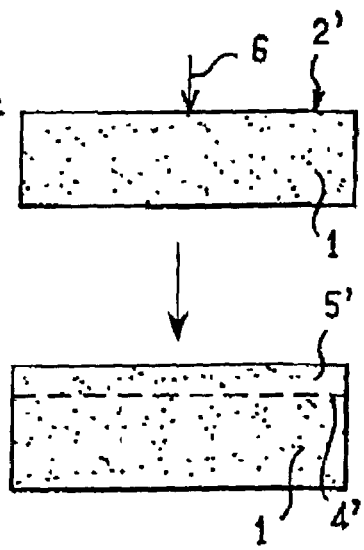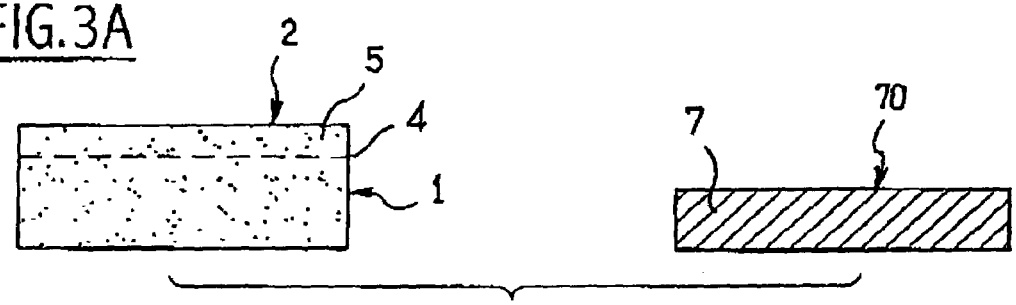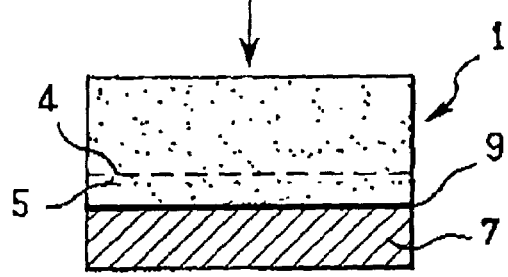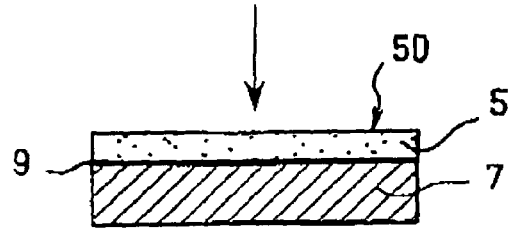

METHOD FOR MANUFACTURING A FREE-STANDING SUBSTRATE MADE OF MONOCRYSTALLINE SEMICONDUCTOR MATERIAL

CROSS-REFERENCE TO RELATED APPLICATIONS

This application is a continuation-in-part of U.S. patent application Ser. No. 10/349,295 filed Jan. 22, 2003; now U.S. Pat. No. 6,964,914 and this application is a continuation-in-part of U.S. patent application Ser. No. 11/009,138 filed Dec. 13, 2004, now U.S. Pat. No. 7,071,029 which is a division of U.S. patent application Ser. No. 10/446,604 filed May 27, 2003, now U.S. Pat. No. 6,867,067 which is a continuation of International Application No. PCT/FR01/03715 filed Nov. 26, 2001. The entire content of these applications is hereby incorporated herein by reference thereto.

FIELD OF THE INVENTION

This invention relates to a method for manufacturing a free-standing substrate made of mono-crystalline semiconductor material, and in particular of a wide band gap material.

BACKGROUND ART

A free-standing substrate is defined as a substrate, whose thickness is sufficient that it carries itself without support. Reasonably, such a substrate must thus have a thickness of at least 100 µm. However, in order to be able to be manipulated in a manufacturing line without risk of breaking, it must generally be thicker.

By way of example, the commercially available free-standing substrates comprised of GaN or AlN have a thickness of 300 µm. Such free-standing substrates comprised of GaN or AlN are used in onto-electronic devices such as LEADS, lasers, sensors or in micro-electronic devices (transistors) or function in a high-temperature environment, or even in the field of hyper frequency power or power electronics.

A first possibility for obtaining free-standing substrates can comprise fashioning them from a block of the material concerned by sawing and polishing.

Unfortunately, at the present time, there is no manufacturing method for GaN or AlN ingots that can be used on an industrial development scale.

The article "Bulk and homo epitaxial GaN growth and characterization", Porowski-S, Journal of Crystal Growth, Vol. 189-190, June 1998, pp 153-158, describes a process for growing monocrystalline GaN ingots in the liquid phase under a pressure of 12 to 20 kbars (12 to $20 \times 10^8$ Pa) and at a temperature of between 1400 and 1700° C. These conditions are difficult to implement, however, in the course of mass production. In addition, they only produce crystals having a maximum diameter of 18 mm.

Other teams of researchers have also worked on methods for growing ingots in liquid phase at reduced pressure (less than 2 bars ($2 \times 10^5$ Pa)) and at a temperature of 1000° C. The diameter of the crystals obtained is larger, in the vicinity of 50 mm, but the crystalline quality obtained is less satisfactory than in the previously mentioned method.

Finally, the article "Growth and characterization of GaN single crystals", Balka et al., Journal of Crystal Growth, Vol. 208, January 2000, pp. 100-106, discloses the growth of monocrystalline GaN by sublimation. The manufacturing conditions used are a pressure of less than 1 bar ($10^5$ Pa) and a temperature of from 1000 to 1200° C. The crystal quality is very good but the size of the crystal is 3 mm, which is clearly inadequate for the intended applications in the semiconductor field.

At the present time, there is no monocrystalline gallium nitride or aluminum nitride on the market, in a massive form, of good quality, having sufficient diameters and at a reasonable price. In order to resolve this problem, one notes in the literature a number of attempts at manufacturing substrates comprised of monocrystalline, free-standing gallium nitride by thick heteroepitaxy and then eliminating the epitaxy substrate. This thick epitapy or hydride vapor phase epitapy (known to the skilled artisan under the acronym HVPE or "hydride vapor phase epitapy") consists of producing epitaxial growth of GaN on diverse substrates between 1000° C. and 1100° C. at atmospheric pressure with a view to obtaining a layer of GaN of several tens or hundreds of microns. This technique is advantageous in that it enables one to obtain a good crystal quality and in that it is not necessary to face or to cut the ingots of crude material as in the aforementioned prior art. However, the GaN plates obtained in this fashion have many residual stresses and tensions connected with heteroepitaxy.

Several methods are distinguished according to the nature of the epitaxy support substrate and the technique used to remove the substrate. Thus, according to the article "Physical properties of bulk GaN crystals grown by HVPE", Melnik et al., MRS Internet Journal of Nitride Semiconductor Research, Vol. 2, Art. 39, a method for growing GaN monocrystals using HVPE on a substrate comprised of monocrystalline silicon carbide (SiC) with removal of the substrate by reactive ionic etching (known to the person skilled in the art under the acronym RIE according to the English expression "reactive ionic etching"). However, removal of this SiC substrate is very time-consuming because it is chemically very inert.

Also, according to the article "Large free-standing GaN substrates by hydride vapor phase epitaxy and laser-induced lift-off," Kelly et al., Jpn. J. Appl. Phys., Vol. 38, 1999, a method for growing GaN by HVPE epitaxy on a sapphire substrate and subsequent removal of the substrate by laser is known (known by the English terminology, "laser-induced lift-off"). Implementing this removal technique is delicate for treating large surfaces because the laser beam scanning is long.

It is also possible to remove the sapphire substrate by mechanical polishing but this method is likewise time-consuming and further presents the risk of breakage of the GaN layer at the time of removal of the substrate that releases the stresses.

In other respects, the article "Preparation of large free-standing GaN substrates by hydride vapor phase epitaxy using GaAs as a starting substrate," Motoki et al., Jpn. J. Appl. Phys., Vol. 40 (2001), pp. L140-L143 describes a method for growing GaN on a substrate comprised of gallium arsenide (GaAs) by HVPE and then chemical dissolution of the substrate. This technique enables easy removal of the substrate, however, the latter is lost, which is less of an advantage from an economic point of view.

Other attempts have also been made by implementing a technique comprised of growing GaN or aluminum nitride (AlN) on a supporting substrate of silicon (Si {111}) by HVPE and then removing the supporting substrate by chemical etching. This technique has the same drawbacks as those mentioned previously.

Finally, according to U.S. Pat. No. 6,176,925, U.S. Patent applications Publication Nos. 2001/0006845 and 2001/00022154 and European Patent Application No. 1,045,431, methods are known for obtaining a thick layer of gallium nitride by epitaxial techniques on a seed layer which itself has been obtained by epitaxy. However, none of these four documents mention the possibility of placing a nucleation layer on a support by molecular adhesion bonding.

The important points for realizing free-standing substrates are on the one hand the capacity of realizing thick epitaxy; that is, at least 100 microns while having good crystal quality and on the other hand easy separation of the thick layer from its epitaxy support. The present invention now remedies the aforementioned drawbacks while respecting these important points.

SUMMARY OF THE INVENTION

The invention relates to methods for manufacturing a free-standing substrate made of a semiconductor material, preferably of a mono-crystalline semiconductor material that is most preferably of a wide band gap material, such as gallium nitride (GaN), aluminum nitrate (AlN), diamond, or silicon carbide (SiC). Wide band gap materials are known in the art and generally have a band gap value above 1.5 eV.

This method comprises providing a first assembly by bonding a nucleation layer of a first material to a support of a second material, with a removable bonding interface being defined and located between facing surfaces of the nucleation layer and the support; growing, by epitaxy on the nucleation layer, a substrate of a layer of a third material to form a second assembly with the substrate attaining a sufficient thickness to be free-standing, with at least the substrate being heated to an epitaxial growth temperature, wherein the third material is a wide band gap material; and selecting the coefficients of thermal expansion of the second and third materials to be different from each other by a thermal expansion differential, determined as a function of the epitaxial growth temperature or subsequent application of external mechanical stresses, such that, as the second assembly cools from the epitaxial growth temperature, stresses are induced in the removable bonding interface to facilitate detachment of the nucleation layer and the substrate from the support.

Another method comprises preparing a first assembly that includes a relatively thinner nucleation layer of a first material, a support of a second material, and a removable bonding interface defined between facing surfaces of the nucleation layer and support;

growing, by epitaxy on the nucleation layer, a substrate of a relatively thicker layer of a third material, to form a second assembly with the substrate attaining a sufficient thickness to be free-standing while preserving the removable character of the bonding interface, with at least the substrate being heated to an epitaxial growth temperature; and selecting the coefficients of thermal expansion of the second and third materials to be different from each other by a thermal expansion differential, determined as a function of the epitaxial growth temperature or subsequent application of external mechanical stresses, such that, as the second assembly cools from the epitaxial growth temperature, stresses are induced in the removable bonding interface to facilitate detachment of the nucleation layer from the substrate.

In these methods, the coefficients of thermal expansion of the second and third materials are preferably selected to be sufficiently different from each other so that the nucleation layer and substrate become detached as the second assembly cools to ambient from the epitaxial growth temperature. Alternatively, a thermal treatment can be applied to raise stresses in the removable bonding interface to assist in the detachment of the nucleation layer and substrate. Also, an external stress can be applied to assist in the detachment of the nucleation layer and substrate. The external stress includes mechanical stresses applied from a jet of fluid or a blade, such as a guillotine.

The substrate is preferably a monocrystalline material that can be deposited at least in part by hydride vapor phase epitaxy (HPVE). Advantageously, the nucleation layer can be applied onto the substrate by direct bonding with molecular adhesion, and the removable bonding interface is located between the facing surfaces of the nucleation layer and the substrate. If desired, the first assembly can be provided with at least one intermediate bonding layer positioned between the nucleation layer and the substrate. Alternatively, the first assembly can be provided with two intermediate bonding layers, one positioned adjacent the nucleation layer and the other positioned adjacent the substrate, with the removable bonding layer created by opposed contacting surfaces of the intermediate bonding layers. Preferably, one of the intermediate bonding layers is a layer of silicon oxide ($SiO_2$) or silicon nitride ($Si_3N_4$).

The method of the invention also contemplates creating the bonding interface by effecting a treatment for augmenting the roughness of the facing surface of at least one of the nucleation layer or the substrate. This can be done by chemical attack or etching. Also, the bonding interface can be created by effecting a treatment for decreasing hydrophily of the facing surface of at least one of the nucleation layer or the substrate.

The epitaxial growing of the substrate includes initially providing a fine nucleation layer on the nucleation layer in order to improve the crystal quality of the deposited third material. The fine nucleation layer may be provided by metal organic chemical vapor deposition (MOCVD) epitaxy or by molecular beam (MBE) epitaxy. If desired, the nucleation layer can be eliminated so that the substrate becomes a free-standing structure.

The nucleation layer can be formed by implantation of an atomic species into a source substrate to a defined depth to form at an embrittled zone that defines a boundary of the nucleation layer in the source substrate. The source substrate may be monocrystalline or polycrystalline and preferably is carbide, silicon, sapphire, gallium nitride or aluminum nitride, generally in the form of a wide bandgap material. The preferred nucleation layer is a monocrystalline material of gallium nitride, silicon, silicon carbide, sapphire, diamond, or aluminum nitride. One advantageous combination is a substrate of diamond and a nucleation layer of diamond, silicon or silicon carbide.

The invention also relates to a semiconductor material made of a relatively thinner nucleation layer of a first material, a support of a second material, and a removable bonding interface defined between facing surfaces of the nucleation layer and support, and a substrate of a relatively thicker layer of a third material to form an assembly wherein the substrate has a sufficient thickness to be free-standing while preserving the removable character of the bonding interface, with the second and third materials having coefficients of thermal expansion that are different from each other by a thermal expansion differential, determined as a function of the epitaxial growth temperature or subsequent application of external mechanical stresses, such that, stresses are induced in the removable bonding interface to facilitate detachment of the nucleation layer from the substrate.

BRIEF DESCRIPTION OF THE DRAWINGS

Other aspects, objects and advantages of the invention will emerge on reading the detailed description that follows. This description will be better understood when read with reference to the annexed drawings, wherein:

FIGS. 1-6 are representations illustrating different series of successive stages of the method according to the invention and their variants, with:

FIG. 1 illustrates a source material having an embrittled zone;

FIGS. 2A and 2B illustrates a source material that is subjected to a porosification treatment (FIG. 2A), followed by epitaxial growth of another material thereon (FIG. 2B);

FIGS. 3A, 3B and 3C illustrates the application of a nucleation layer from a source material onto a support (FIGS. 3A and 3B), and the resulting structure (FIG. 3C) after removal of the source material along the embrittled zone.

Figure 4A:
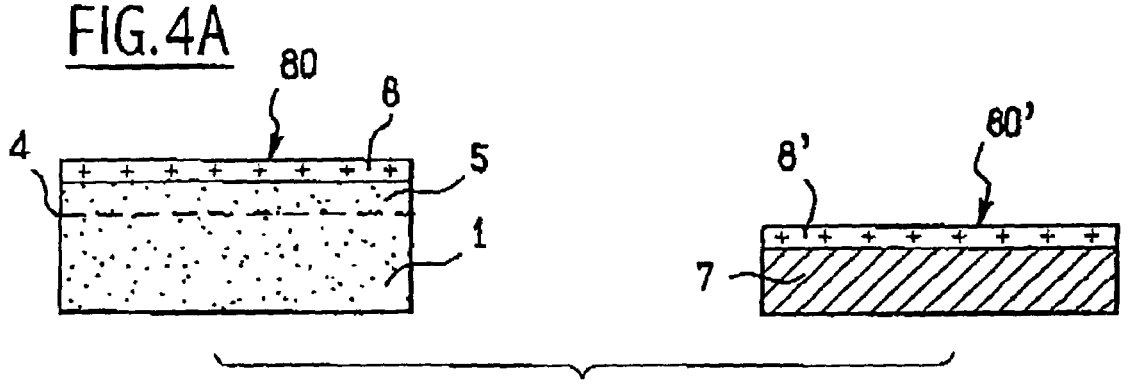
FIGS. 4A, 4B and 4C illustrates another application of a nucleation layer from a source material onto a support (FIGS. 4A and 4B), and the resulting structure (FIG. 4C) after removal of the source material along the embrittled zone.

In these drawing figures it will be noted that the different layers are not represented in their actual scale, especially regarding their thicknesses, but are instead shown schematically to illustrate the method steps and resulting structures.

DETAILED DESCRIPTION OF THE PREFERRED EMBODIMENTS

The present invention relates to a method for manufacturing a free-standing substrate made of microcrystalline semiconductor material. A preferred aspect of this method includes the following constituent steps:

transferring a thin nucleation layer onto a support by creating between the two a removable bonding interface;

growing by epitaxy on the thin nucleation layer, a microcrystalline layer of material intended to comprise the substrate until it attains a sufficient thickness to be free-standing, while preserving the removable character of the bonding interface, choosing the coefficients of thermal expansion of the material of the substrate and of the support material to be different from each other with a difference determined as a function of the temperature of epitaxial growth and a possible application of external mechanical stresses such that at the time of cooling the assembly, starting from the epitaxial growth temperature, the stresses induced by differential thermal expansion between the support material and that of the substrate, combined, if required, with the application of exterior mechanical stresses, causing the removal of the nucleation layer and the monocrystalline substrate from the support at the level of the removable bonding interface.

The method according to the invention also has the following advantageous characteristics, taken in isolation or in combination:

the deposition of the substrate by epitaxy is realized at least in part by hydride vapor phase epitaxy (HVPE);

the thin nucleation layer is applied onto the support by direct bonding by molecular adhesion, the removable bonding interface being comprised of the contact surface between the this nucleation layer and the support;

before applying the nucleation thin layer onto the support, a first bonding interface is applied onto at least one of the two, the removable bonding interface being comprised of the surface contact between on the one hand the first bonding intermediate layer and on the other hand the second bonding intermediate layer or the nucleation thin layer or the support;

at least one of the bonding interfaces is a layer of silicon oxide ($SiO_2$);

at least one of the bonding interfaces is a layer of silicon nitride ($Si_3N_4$);

the bonding interface is made removable by applying a treatment for augmenting the roughness of at least one of the two contact faces at the level of the bonding interface;

the treatment for augmenting the roughness of the surface is done by chemical attack;

the bonding interface is made removable by carrying out a treatment for reducing the hydrophily of at least one of the two faces in contact with the bonding interface;

the bonding interface is made removable by a thermal treatment using a thermal budget with a view to reducing the bonding energy between the two faces in contact with the bonding interface;

The method comprises growing by epitaxy a fine nucleation layer on the nucleation thin layer prior to growing by epitaxy the substrate. The nucleation fine layer is created by metalo-organic chemical vapor deposition (MOCVD) epitaxy or by molecular beam epitaxy (MBE). The exterior mechanical stresses applied at the time of removal are chosen from application of a jet of fluid, use of a blade or a guillotine. The method comprises the additional step of elimination of the nucleation layer that remains integral with the substrate intended for comprising the free-standing substrate. Furthermore, prior to applying the nucleation thin layer onto the support, the nucleation layer is formed by implantation of atomic species to the interior of a source substrate, in the vicinity of a defined depth, in such a fashion as to define at the depth a weakened or embrittled zone separating the nucleation layer from the rest of the source substrate.

The monocrystalline material comprising the free-standing substrate is preferably a prohibited broadband material, such as gallium nitride (GaN) or aluminum nitride (AlN). The support is preferably monocrystalline or polycrystalline and is chosen from silicon carbide, silicon, sapphire, gallium nitride or aluminum nitride. The nucleation thin layer is realized using a monocrystalline material chosen from gallium nitride, silicon, silicon carbide, sapphire, diamond or aluminum nitride. The substrate is realized using diamond and the nucleation layer is diamond, silicon or silicon carbide.

before transferring the thin nucleation layer onto the support, a first intermediate bonding layer is applied onto at least one of the two, the removable bonding interface being comprised of the contact surface between on the one hand the first intermediate bonding layer and on the other hand the second intermediate bonding layer or the thin nucleation layer or the support;

at least one of the intermediate bonding layer is a layer of silicon oxide ($SiO_2$);

at least one of the intermediate bonding layer is a layer of silicon nitride ($Si_3N_4$);

the bonding interface is made removable by effecting a treatment for augmenting the roughness of at least one of the two faces in contact at the level of the bonding interface;

the treatment for augmenting the roughness of the surface is carried out by chemical attack or etching;

the bonding interface is made removable by effecting a treatment for decreasing the hydrophily of at least one of the two faces in contact with the bonding interface;

the bonding interface is made removable by a thermal treatment using a thermal budget with a view of reducing the bonding energy between the two faces in contact at the level of the bonding interface;

the method comprises, prior to the epitaxial growth of the substrate, growing by means of epitaxy a fine nucleation layer on the nucleation thin layer;

the fine nucleation layer is produced by means of metal organic chemical vapor deposition (MOCVD) epitaxy or by molecular beam epitaxy (MBE);

the external mechanical stresses applied at the time of removal are chosen from application of a jet of fluid, use of a blade or a guillotine;

the method comprises the step of supplementary elimination of the nucleation layer that remains integral with the substrate intended to form the free-standing substrate;

prior to transferring the thin nucleation layer onto the support, the nucleation layer is formed by implantation of atomic species at the interior of a source substrate, in the vicinity of a defined depth, in such a fashion as to define at the depth an embrittled zone separating the nucleation layer from the rest of the source substrate;

the support is monocrystalline or polycrystalline and is chosen from silicon carbide, silicon, sapphire, gallium nitride or aluminum nitride;

the monocrystalline material comprising the free-standing substrate is preferably a wide bandgap material. Any wide bandgap material having a a bandgap value above 1.5 eV can be used. Specifically preferred wide bandgap materials include gallium nitride (GaN); aluminum nitride (AlN); or silicon carbide (SiC);

the thin nucleation layer is realized using a monocrystalline material chosen from gallium nitride, silicon, silicon carbide, sapphire, diamond or aluminum nitride;

the substrate is realized in diamond and the nucleation layer is realized in diamond, silicon or silicon carbide.

The method in its entirety will first be briefly described. This method comprises:

bonding a seed layer or "nucleation layer" on a mechanical support by means of a removable bonding interface, then growing, by epitaxy, on the nucleation layer, a substrate of the material comprising the substrate that is to be obtained, by thus forming a stack of layers and then removing the substrate and the nucleation layer, from the mechanical support, at the level of the removable bonding layer, in particular by imposing thermal stresses associated to the gap between the thermal expansion coefficients of the different layers constituting the stack, and eventually mechanical stresses.

This method will now be described in more detail.

FIG. 1 represents a first variant for obtaining the nucleation layer. The purpose of the method according to the invention is the manufacture of the free-standing substrates in a monocrystalline semi-conductor material, namely using a material having a wide prohibited band, and particularly those substrates comprised of gallium nitride (GaN) or aluminum nitride (AlN), or under certain conditions even diamond.

In order to prepare the nucleation layer, a source substrate 1 is chosen, whose nature and crystal lattice parameters enable the subsequent growth by epitaxy thereupon of a thick monocrystalline layer that will constitute a free-standing substrate for the nucleation layer. Consequently, one can choose in a particularly appropriate fashion as the source substrate 1, a monocrystalline material such as gallium nitride (GaN), silicon (Si); silicon carbide (SiC), sapphire, diamond or aluminum nitride (AlN). It should be noted that when the free-standing substrate is made of diamond, the nucleation layer should preferably also be made of diamond, silicon or silicon carbide.

An atomic species implantation operation 3 is carried out on one of the flat surfaces of this substrate 1, called the frontal face 2. Implantation of an atomic species is defined as any bombardment of atomic, molecular, or ionic species capable of introducing the species into a material with a maximum of concentration of the species in the material, the maximum being at a defined depth with respect to the bombarded surface 2. The atomic, molecular or ionic species is introduced into the material using an energy equally distributed around a maximum. The implantation of the atomic species into the source substrate 1 can be done, for example, using an ion beam implanter or a plasma immersion implanter. Preferably, this implantation is done by ionic bombardment. Also preferably, the ionic species implanted is hydrogen. Other ionic species can be advantageously used alone or in combination with hydrogen such as rare gases (e.g., helium).

This implantation has the effect of creating in the volume of the source substrate 1 and at an average depth of ion penetration, an embrittled zone 4 separating the substrate 1 into two parts. On this subject, reference is made to the literature concerning the well known SMART-CUT® method.

The embrittled zone 4 formed in this fashion delimits the one layer 5 corresponding to the upper part of the substrate 1 and extending from the bombarded surface 2 to the embrittled zone 4 and a lower part corresponding to the rest of the source substrate 1. This layer 5 will later constitute the nucleation layer.

By way of example, the energy of implantation that can be obtained using the equipment currently available in microelectronics is such that the maximal thickness of the nucleation layer 5 is of the order of 0.5μ to 1.5μ. Using more powerful implanters it is possible to obtain a thicker nucleation layer 5. Thus, the skilled artisan can select the appropriate bombardment ions and energy to achieve the desired thickness of layer 5.

FIGS. 2A and 2B represent a variant for obtaining the nucleation layer. The source substrate 1 used is identical to that described above. A so-called porosification treatment 6 is effected on the frontal surface 2'. By way of example, one can refer to EP 0 849 788, which describes such a process. Then one proceeds with the epitaxial growth on this frontal surface 2' of a supplemental layer 5' of a material preferably identical to that of the source substrate 1. The porosification treatment thus enables forming a layer or embrittled zone 4' imbedded between the source substrate 1 and the layer 5'; the latter constituting the future nucleation layer.

FIGS. 3A to 3C represent the application of the nucleation layer 5 on the support 7. In these figures, as well as in FIGS. 4 to 6, for the sake of simplification, only the nucleation layer showing numeral reference 5 is represented; in other words, that one obtained by the method represented in FIG. 1. However, it is quite obvious that it could also be the layer referenced using 5' and obtained by the porosification method described in conjunction with FIGS. 2A and 2B or by any other similar method.

In a first variant embodiment represented in FIG. 3B, the bonding between the nucleation layer 5 and the support 7 is made by molecular adhesion. These bonding techniques are known to the skilled artisan and are described, for example, in the paper by Gosële, "Semiconductor wafer bonding", Sciences and Technology, Q. Y. Tong, U. Gosële, Wiley Interscience Publications.

Figure 4B:
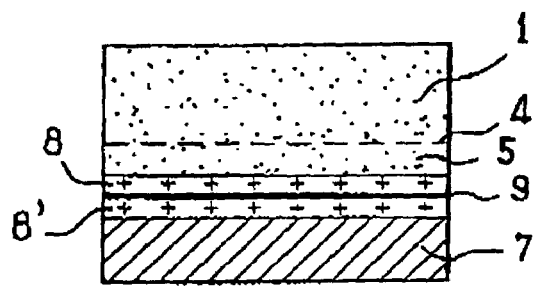
Figure 4C:
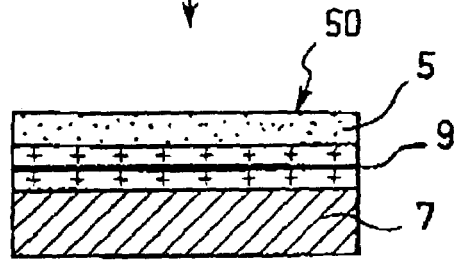

In a second variant embodiment, represented by FIGS. 4A and 4B, the bonding is done by application of a first intermediate bonding layer 8 on the nucleation layer 5 and a second intermediate bonding layer 8' on the support 7, then bonding of the two intermediate layers 8 and 8' on each other by molecular adhesion as hereinbefore described.

Finally, in a third variant embodiment (not represented in the figures) a single intermediate bonding layer 8' is applied on the support 7 and then bonded on top of the nucleation layer 5 or, inversely, a single intermediate bonding layer 8 is applied on the nucleation layer 5 and it is then bonded on top of the support 7.

These bonding layers 8, 8' are of a thickness in the area of 0.5μ and are advantageously layers of oxide, for example, $SiO_2$ or nitride, for example $Si_3N_4$, deposited by chemical vapor deposition. It is also possible to intercalate intermediate bonding layers 8, 8' of different types, for instance, one layer of oxide and one layer of nitride, between the support 7 and the nucleation layer 5.

The support 7 and the nucleation layer 5 are then assembled as shown in FIGS. 3B and 4B by way of a bonding interface referenced by numeral 9. The term "bonding interface" is defined as the contact surface between two facing surfaces, assembled with each other by bonding. According to the different cases mentioned above, it can be either the contact surface between the frontal surface 2 of the nucleation layer 5 and the frontal face 70 of the support 7 (see FIGS. 3A and 3B) or the contact surface between the respective frontal surfaces 80, 80' of the two intermediate bonding layers 8 and 8' (see FIGS. 4A and 4B).

Finally, when one single intermediate bonding layer is applied between the nucleation layer 5 and the support 7, the bonding interface 9 is then the contact surface between the intermediate layer and, depending on the situation, the frontal face 2 of the nucleation layer 5 or the frontal face 70 of the support 7 which was bonded on the intermediate layer.

According to an important characteristic of the invention, this bonding interface 9 is removable. This means that a treatment is effected prior to the molecular adhesion bonding step, which is intended to reduce the bonding energy level at the bonding interface 9 in such a fashion as to bring it to a level lower than that obtained by normal bonding.

In the course of the description and the claims, the expression "normal bonding" is defined as an operation comprising classical bonding by molecular adhesion of two surfaces against each other after normal preparation of the surfaces; in other words, cleaning in baths of chemical products then thermal annealing; for more information on this subject see the following publications: C. Maleville et al., Semiconductor wafer bonding, Science Electrochemical Society Proceeding Series, Permington, N.J. (1998) and O. Rayssac et al. "Proceeding of the $2^{nd}$ International Conference on Materials for Microelectronics," IOM Communications, p. 183, 1998.

Of course, the value of this bonding energy is a function of the nature of the materials in contact along the bonding interface, of the temperature at which the molecular adhesion bonding is effected, and of the temperature at which the thermal annealing is effected. By way of purely illustrative example, in the case of bonding of a layer of $SiO_2$ to another layer of $SiO_2$, the bonding energy between the two layers of $SiO_2$ is in the area of 100 mJ/m$^2$ for bonding done at ambient temperature and after normal preparation of the surfaces and can attain 1 to 2 J/m$^2$ after annealing treatments between 400 and 1100° C. After treatment intended to reduce the bonding energy level, for example by roughening as described above, all of the other parameters being otherwise identical, the roughness is in the area of 0.625 nm RMS and the bonding energy after the annealing cycle at 100° C. is in the area of only 500 mJ/m$^2$. Essentially identical values are obtained using $SiO_2$/Si bonding. At the time of removal, disassembly is necessarily effected in the plane of the bonding interface 9 and not irregularly along a fracture line that would at times extend into one of the opposing surfaces or into the opposing face, or between the two.

Various examples of treatment methods enabling reduction of the bonding energy level and making the bonding interface 9 removable will now be described. A first method consists of increasing the roughness of at least one of the two faces in contact. This increase of the roughness can be done locally by chemical attack or etching using hydrofluoric acid (HF), for instance; see the article by O. RAYSSAC et al., for example.

A second method consists in reducing the hydrophilicity of the surfaces to be brought into contact, prior to the actual bonding by chemical cleaning using methods, for example, as described in the previously mentioned article by C. Maleville.

A third method for obtaining a removable bonding interface consists in reducing the thermal budget normally sufficient to achieve bonding energies currently obtained by standard bonding. The thermal budget corresponds to the temperature of a thermal treatment multiplied by the duration of the treatment.

Finally, it should be noted that it is possible to utilize any of the aforementioned methods alone or in combination.

As concerns the support 7, this plays essentially a mechanical support role. It is advantageously chosen from silicon carbide, silicon, sapphire, gallium nitride or aluminum nitride.

Then the nucleation layer 5 is removed from the rest of the source substrate 1 along the embrittled zone 4 (see FIGS. 3B and 3C or 4B and 4C). The exposed top surface of the nucleation layer 5 is indicated by the numerical reference 50. In order to allow detachment along the embrittled zone 4 and not along the bonding interface 9, it is necessary that the embrittled zone 4 has a mechanical strength that is lower than that of the bonding interface 9.

In the case where the embrittled zone 4 is formed by hydrogen implantation, detachment is effected either solely under the action of the application of an appropriate thermal budget by heating the layer stack formed at a sufficient temperature so as to induce detachment (typically 500° C. for silicon and 900° C. for silicon carbide), or by the application of external mechanical stresses with or without the joint application of a thermal budget. It should be noted that the thermal budget applied must, however, be limited in such a fashion as to conserve the removable character of the bonding interface 9.

Application of a mechanical stress can consist in exerting a bending and/or traction force on the posterior part of the source substrate 1 or introducing at the embrittled zone 4 a blade or a jet of fluid (gas or liquid), for example. It can also take the form of application of shearing or ultrasound forces. The external mechanical stresses can also be of electrical energy origin deriving from the application of an electrostatic or electromagnetic field. Finally, the external mechanical stresses can also be of thermal energy origin deriving from the application of an electromagnetic field, an electron beam, thermoelectric heating, a cryogenic fluid, a super-cooled liquid, etc.

After detachment along embrittled zone 4, a stack comprised of the mechanical support 7 and the nucleation layer 5 is obtained, between which one (or a plurality) of intermediate bonding layer(s) 8, 8' (see FIGS. 3C or 4C) may be intercalated. A finishing operation can be operated on the exposed top surface 50 of the nucleation layer 5 in order to improve the compatibility of the surface with the subsequent epitaxial growth. This finishing operation can be done by polishing, etching or thermal treatment and, in the last-mentioned case, it is assured that the application of the additional thermal budget does not destroy the removable character of the bonding interface 9.

Other techniques for obtaining the nucleation layer 5 on the support 7 are well known to the person skilled in the art and can also be utilized. For example, one technique derived therefrom can be cited, which enables obtaining substrates of the type known to the person skilled in the art under the acronym BESOI or 'bond an etch back silicon on insulator' or also BSOI, 'bonded SOI'. These techniques consist in bonding the source substrate 1 directly onto the support 7 and then proceeding with physical removal of the back of the source substrate either by polishing techniques or by chemical etching techniques until a layer 5 of the desired thickness is obtained. In most cases, the nucleation layer will be relatively thin compared to the monocrystalline support substrate. The relative thicknesses can be selected as needed for the intended application of the structure, and these are well known to the skilled artisan.

Figure 5A:
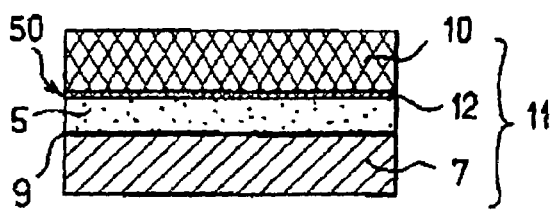
FIGS. 5A, 5B and 5C illustrates the deposition of a monocrystalline layer onto the nucleation layer (FIG. 5A) prior to removal of the support (FIG. 5B) and nucleation layer (FIG. 5C)
Figure 6A:
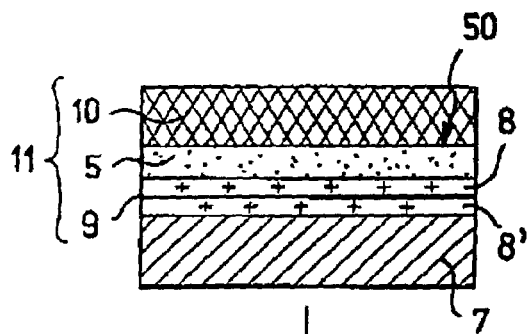
FIGS. 6A, 6B and 6C illustrates another application for the deposition of a monocrystalline layer onto the nucleation layer (FIG. 6A) prior to removal of the support (FIG. 6B) and nucleation layer (FIG. 6C)

As illustrated in FIGS. 5A and 6A, a relatively substrate 10 of the monocrystalline substrate that one wishes to obtain can be first deposited on the exposed upper surface 50 of the nucleation layer 5. Thus, a stack (reference 11) is obtained.

Advantageously, this substrate layer 10 deposit is effected by epitaxy and at least partly by means of hydride vapor phase epitaxy (known to the person skilled in the art under the acronym HVPE or 'hydride vapor phase epitaxy'). This deposit is effected at a temperature between 1000 and 1100° C., preferably 1050° C. Care is taken to maintain this temperature in a range of values allowing preservation of the removable character of the bonding interface 9. This deposit is continued until achieving a sufficient thickness that the layer 10 is ultimately free-standing when it is removed from the support 7. The method of realizing this epitaxy, the parameters and the respective orientation of the nucleation layer and the substrate are known to the skilled artisan.

Figure 5B:
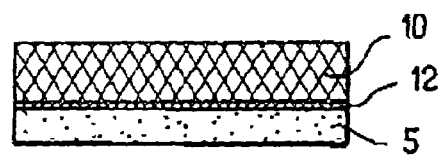
Figure 5C:
Figure 6B:
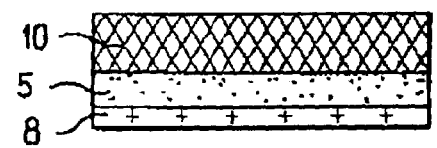
Figure 6C:

According to one embodiment of the invention represented in FIGS. 5A and 5B for the sake of simplification but which could also be done using the method variant represented in FIGS. 6A to 6C, it is also possible to proceed, prior to deposit of the substrate 10, with a growth phase by means of epitaxy of a fine nucleation layer 12. This can be done using the same material as that used subsequently for the realization of the substrate 10 but not necessarily identical to that of the nucleation layer 5. This step can be advantageous for improving the crystal quality of the substrate 10.

In this instance, and particularly for GaN, epitaxy of this fine layer can be realized by metal organic chemical vapor deposition (known to the skilled artisan under the acronym MOCVD) or by molecular beam epitaxy (known to the skilled artisan under the acronym MBE). It is also possible to use lateral growth techniques known to the skilled artisan under the acronym ELOG or epitaxial lateral over-growth.

According to another embodiment, the material used to form the fine nucleation layer 12 can also be different from that used for the substrate 10 and for the nucleation layer 5. By way of example, a fine epitaxial layer of AlN can be deposited on a nucleation layer of SiC prior to growth of a substrate of GaN. The formation techniques used for the fine epitaxial layer are identical to those hereinbefore described.

As illustrated in FIGS. 5B and 6B, the support 7 and the intermediate bonding layer 8', if present, will be removed from the rest of the stack comprised of the nucleation layer 5 and the substrate 10 and, when present, intermediate bonding layer 8. This removal is done along the removable bonding interface 9.

The coefficients of thermal expansion are fixed values established for a given material. However, the expansion of the material and its elastic energy depend on its thickness. In a stack of layers, the behavior of the different layers is dictated in a first approximation by the thickest layer(s). In the present case, the nucleation layer 5 has a thickness of several microns, while the monocrystalline layer 10 is more in the area of 100μ or even 200μ and the support is at least 300μ thick. Consequently, in the first approximation the thermal expansion coefficients of the support 7 and those of the monocrystalline layer 10 are taken into account in order to predict the removal behavior of these two layers. At the second level, the presence and the nature of the intermediate bonding layer(s) can be significant for the distribution of the stresses in the structure considered.

In other words, if as a result of the nature of the materials chosen for the support 7 and the monocrystalline layer 10, the difference between their coefficients of thermal expansion is significant, then removal can be achieved naturally, along the removable bonding interface 9, when the temperature of the stacking 11 decreases, after epitaxy realized between 1000 and 1100° C. When, on return of the stack 11 to ambient temperature (around 20 to 25° C.) require additional application of exterior mechanical stresses. These stresses are identical to those mentioned above for the detachment along the embrittled zone 4.

Finally, elimination of the nucleation layer 5 is effected (see FIGS. 5C and 6C) by polishing, ionic etching or by attack using a chemical solution, for example. The choice of the technique used is a function of the nature of the material of the layer 5 and is generally known to the skilled artisan.

Later, it is also possible to realize a finishing step comprising removal of several tens of microns from the part of the monocrystalline layer 10 that is situated in contact with the nucleation layer 5. The support 7 can also be recovered and recycled.

EXAMPLES

Four exemplary embodiments of the method of the invention are now described in detail.

Example 1

Manufacturing of a free-standing GaN substrate using an intermediate stack comprising a silicon Si support, two intermediate $SiO_2/SiO_2$ bonding layers and a monocrystalline GaN nucleation layer.

A monocrystalline gallium nitride (GaN) nucleation layer 5 is formed in a solid source substrate 1 of solid GaN by ion implantation. This nucleation layer 5 is bonded onto a silicon mechanical support 7 by two intermediate bonding layers 8, 8' of $SiO_2$ bonded together along a bonding interface 9.

Prior to being assembled together, the two intermediate layers 8, 8' undergo mechano-chemical planarization and surface treatment intended to increase roughness of the opposing surfaces 80, 80' (e.g., a treatment with hydrofluoric acid HF or with a chemical cleaning solution known to the skilled artisan the name SC1 and comprised principally of ammonia diluted with hydrogen peroxide $H_2O_2$) of the opposing surfaces 80, 80').

Then the nucleation layer 5 is detached from the rest of the substrate 1 along the embrittled zone 4 using a thermal treatment done at 900° C.

Thermal treatment for stabilization of the bonding interface 9 is done at 950° C. over 2 hours; in other words, at a temperature slightly higher than that currently used for bonding of this type. The bonding interface 9 is thus removable.

Then a surface finishing step is done on the exposed surface 50 of the nucleation layer 5.

One then proceeds with rapid growth of a GaN layer 10 using HVPE at 1050° C. At this temperature, the bonding interface 9 is slightly reinforced but has, however, bonding forces greatly lower than the standard bonding energies (that is, around 1 to 2 J/m$^2$).

When the GaN attains a thickness of 200 m; that is a thickness sufficient to be ultimately free-standing, deposition is stopped and the stack of the layers obtained is brought to ambient temperature.

The silicon support 7, whose thickness is greater than 300 m is chosen in order to have a coefficient of thermal expansion of 2.5×10$^{-6}$/K, whilst that of the GaN epitaxial substrate 10 is in the area of 5.6×10$^{-6}$/K.

Consequently, the mechanical strength of the stack thus formed is low and disassembly along the bonding interface 9 is done spontaneously when the temperature of the stack, which had reached 1050° C. during the epitaxy process, decreases.

Elimination of the SiO$_2$ layers, the GaN nucleation layer 5, or even several micrometers from the GaN substrate 10 is effected by finishing polishing in order to give it the characteristics of a wafer.

Example 2

Manufacturing of a free-standing AlN substrate using an intermediate stack comprising a silicon Si support, intermediate SiO$_2$/SiO$_2$ bonding layers and a monocrystalline AlN nucleation layer.

One proceeds in identical fashion as described for Example 1, except that the solid gallium nitride is replaced by aluminum nitride (AlN) and that the different AlN layers have a coefficient of thermal expansion in the area of 4.15×10$^{-6}$/K, while the coefficient of thermal expansion of the silicon forming the support is 2.5×10$^{-6}$/K.

Removal is done likewise naturally by lowering the temperature of the stack.

Example 3

Manufacturing of a free-standing GaN Substrate using an intermediate stack comprising a silicon support, a single intermediate bonding layer of SiO$_2$ and a silicon Si {111} nucleation layer.

A nucleation layer 5 of silicon {111} is formed in a source substrate 1 of the same type by ion implantation. This nucleation layer 5 is bonded onto a silicon mechanical support 7 by an intermediate bonding layer 8 of SiO$_2$ obtained by thermal oxidation of the top surface of the source substrate 1. The bonding interface 9 is disposed between the top surface 80 of the SiO$_2$ layer and the frontal surface 2 of the nucleation layer 5.

This bonding interface 9 is treated as in Example 1 so as to be removable.

Then the nucleation layer 5 is removed from the rest of the source substrate 1 along the embrittled zone 4.

A finishing step is then operated on the exposed surface 50 of the nucleation layer 5.

Then fast growth of a GaN layer 10 by HVPE at 1050° C. is realized. At this temperature, the bonding interface 9 is slightly reinforced but has, however, lower than normal bonding forces.

When the GaN attains a thickness of 200 m; that is, a thickness sufficient so as to be ultimately free-standing, deposition is stopped and the stack of layers is brought to ambient temperature.

The silicon support 7, whose thickness is greater than 300 m is chosen to have a coefficient of thermal expansion of is 2.5×10$^{-6}$/K, whilst that of the substrate of epitaxial GaN is in the area of is 5.6×10$^{-6}$/K.

Consequently, the mechanical strength of the stack so formed is low and removal along the bonding interface 9 is done spontaneously when the temperature of the stack, which had reached 1050° C. during epitaxy, decreases.

One then proceeds with the elimination removal of the Si{111} nucleation layer 5 as described in Example 1.

Example 4

Manufacturing of a free-standing GaN substrate using an intermediate stack comprising a silicon support, two intermediate SiO$_2$/SiO$_2$ bonding layers, a monocrystalline SiC nucleation layer and a supplementary fine epitaxial monocrystalline GaN layer.

A nucleation layer 5 of monocrystalline silicon carbide (SiC) is formed in a source substrate 1 of solid SiC by ion implantation. This nucleation layer 5 is bonded onto a silicon mechanical support 7 by two intermediate bonding layers 8, 8' of SiO$_2$ bonded to each other along a bonding interface 9.

This bonding interface 9 is treated as described in Example 1 in such a manner as to be removable and the nucleation layer 5 is detached from the rest of the substrate 1.

A finishing step is then operated on the exposed surface 50 of the nucleation layer 5.

The a fine layer 12 of GaN having a thickness of less than 3 or 4 m is deposited by epitaxial growth by MOCVD. This deposit is done either uniformly over the entire surface of the nucleation layer or locally to achieve the effects of lateral growth (ELOG). Then the layer stack thus formed is allowed to cool until it reaches ambient temperature (around 20° C.).

Then fast growth of a GaN layer 10 by HVPE at 1050° C. is realized. At this temperature, the bonding interface 9 is slightly reinforced but has, however, lower than normal bonding forces (around 2 J/m$^2$).

When the GaN attains a thickness of 200 m; that is, a thickness sufficient so as to be ultimately free-standing, deposition is stopped and the stack of layers is brought to ambient temperature.

The silicon support 7, whose thickness is in the area of 300 to 400 m is chosen to have a coefficient of thermal expansion in the area of 2.5×10$^{-6}$/K, while that of the substrate of epitaxial GaN is in the area of is 5.6×10$^{-6}$/K.

Consequently, the mechanical strength of the stack so formed is low and removal or disassembly along the bonding interface 9 is done spontaneously when the temperature of the stack decreases.

A finishing step is then operated as described in Example 1.

Example 5

Manufacturing of a free-standing diamond substrate using an intermediate stack comprising a silicon Si support, two intermediate $SiO_2/SiO_2$ bonding layers and a diamond nucleation layer.

A nucleation layer 5 of diamond is formed in a source substrate 1 of high crystal quality monocrystalline diamond by ion implantation. This nucleation layer 5 is bonded onto a silicon mechanical support 7 by two intermediate bonding layers 8 of $SiO_2$.

The bonding interface 9 is disposed between the two surfaces 80, 80' of the $SiO_2$ layers. It is treated as described in Example 1 so as to be removable.

Then the nucleation layer 5 is removed from the rest of the substrate 1 along the embrittled zone 4; one then proceeds with a finishing step of the exposed surface 50.

Then fast growth of a diamond layer 10 by CVD (chemical vapor deposition) at between 800 and 1000° C. is realized. At this temperature, the bonding interface 9 is slightly reinforced but has, however, lower than normal bonding forces.

When the diamond attains a thickness of 200 m; that is, a thickness sufficient so as to be ultimately free-standing, deposition is stopped and the stack of layers is brought to ambient temperature.

The silicon support 7, whose thickness is greater than 300 m is chosen to have a coefficient of thermal expansion of is $2.5\times10^{-6}$/K, whilst that of the substrate of diamond is in the area of is $1\times10^{-6}$/K.

Consequently, the mechanical strength of the stack so formed is relatively high and disassembly along the bonding interface 9 cannot be done solely spontaneously when the temperature, which attained 800 to 1000° C. during epitaxy, of the stack decreases. It is necessary to force the separation by using a guillotine.

One then proceeds with the removal of the diamond nucleation layer 5 as described in Example 1.

While illustrative embodiments of the invention are disclosed herein, it will be appreciated that numerous modifications and other embodiments can be devised by those of ordinary skill in the art. Features of the embodiments described herein can be combined, separated, interchanged, and/or rearranged to generate other embodiments. Therefore, it will be understood that the appended claims are intended to cover all such modifications and embodiments that come within the spirit and scope of the present invention.

What is claimed is:

1. A method for manufacturing a free-standing substrate made of a semiconductor material, which comprises:
   providing a first assembly by bonding of a nucleation layer of a first material to a support of a second material at a bonding interface being defined and located between facing surfaces of the nucleation layer and the support, wherein the nucleation layer is applied onto the support by direct bonding with molecular adhesion;
   growing, by epitaxy on the nucleation layer, a substrate of a layer of a third material to form a second assembly with the substrate attaining a sufficient thickness to be free-standing, with at least the substrate being heated to an epitaxial growth temperature, wherein the third material is a wide bandgap material; and
   selecting the coefficients of thermal expansion of the second and third materials to be different from each other by a thermal expansion differential, determined as a function of the epitaxial growth temperature or subsequent application of external mechanical stresses, such that, as the second assembly cools from the epitaxial growth temperature, stresses are induced in the bonding interface to facilitate detachment of the nucleation layer and the substrate from the support.

2. The method of claim 1, wherein the wide bandgap material is silicon carbide.

3. The method according to claim 1, wherein the coefficients of thermal expansion of the second and third materials are selected to be sufficiently different from each other so that the nucleation layer and substrate become detached as the second assembly cools to ambient from the epitaxial growth temperature.

4. The method according to claim 1, which further comprises applying a thermal treatment to raise stresses at the bonding interface to assist in the detachment of the nucleation layer and the substrate.

5. The method according to claim 1, which further comprises applying an external stress to assist in the detachment of the nucleation layer and the substrate by increasing the stress between the materials at the bonding interface.

6. The method according to claim 1, wherein the substrate is a monocrystalline material deposited at least in part by hydride vapor phase epitaxy (HPVE).

7. The method according to claim 1, wherein removal of the bonding interface is facilitated by effecting a treatment for augmenting the roughness of the facing surface of at least one of the nucleation layer or the support.

8. The method according to claim 7, wherein the treatment for augmenting surface roughness is carried out by chemical attack or etching.

9. The method according to claim 1, wherein removal of the bonding interface is facilitated by effecting a treatment for decreasing hydrophilicity of the facing surface of at least one of the nucleation layer or the support.

10. The method according to claim 1, wherein the epitaxial growing of the second material includes initially providing a fine nucleation layer on the nucleation layer in order to improve the crystal quality of the deposited third material of the substrate.

11. The method according to claim 10, wherein the tine nucleation layer is provided by metal organic chemical vapor deposition (MOCVD) epitaxy or by molecular beam (MBE) epitaxy.

12. The method according to claim 1, which further comprises eliminating the nucleation layer after detachment so that the substrate becomes a free-standing structure.

13. The method according to claim 1, which further comprises, prior to bonding the nucleation layer onto the support, forming the nucleation layer by implantation of an atomic species into a source substrate to a defined depth to form an embrittled zone that defines a boundary of the nucleation layer in the source substrate.

14. The method according to claim 13, wherein the source substrate comprises a monocrystalline or polycrystalline wide bandgap material.

15. The method according to claim 14, wherein the wide bandgap material of the source substrate is gallium nitride (GaN) or aluminum nitride (AlN).

16. The method according to claim 1, which further comprises detaching the nucleation layer and the substrate from the support.

17. The method according to claim 16, which further comprises eliminating the nucleation layer after detachment so that the substrate becomes a free-standing structure.

18. A method for manufacturing a free-standing substrate made of a semiconductor material, which comprises:
   providing a first assembly by bonding of a nucleation layer of a first material to at least one intermediate bonding layer present on a support of a second material at a bonding interface being defined and located between facing surfaces of the nucleation layer and the intermediate bonding layer of the support, wherein the nucleation layer is applied onto the intermediate bonding layer of the support by direct bonding with molecular adhesion;

growing, by epitaxy on the nucleation layer, a substrate of a layer of a third material to form a second assembly with the substrate attaining a sufficient thickness to be free-standing, with at least the substrate being heated to an epitaxial growth temperature, wherein the third material is a wide bandgap material; and selecting the coefficients of thermal expansion of the second and third materials to be different from each other by a thermal expansion differential, determined as a function of the epitaxial growth temperature or subsequent application of external mechanical stresses, such that, as the second assembly cools from the epitaxial growth temperature, stresses are induced in the bonding interface to facilitate detachment of the nucleation layer and the substrate from the intermediate bonding layer and the support.

19. The method according to claim 18, wherein the intermediate bonding layer is positioned adjacent the nucleation layer and a second intermediate bonding layer is positioned adjacent the support.

20. The method according to claim 19, wherein at least one of the intermediate bonding layers is a layer of silicon oxide or silicon nitride.

21. A method for manufacturing a free-standing substrate made of a semiconductor material, which comprises:

forming a nucleation layer by implantation of an atomic species into a source substrate to a defined depth to form an embrittled zone that defines a boundary of the nucleation layer from a remainder of the source substrate;

providing a first assembly by bonding the nucleation layer of a first material to a support of a second material, at a bonding interface being defined and located between facing surfaces of the nucleation layer and the support;

detaching the nucleation layer at the embrittled zone to remove the remainder of the source substrate and provide the nucleation layer bonded to the support;

growing, by epitaxy on the nucleation layer, a substrate of a layer of a third material to form a second assembly with the substrate attaining a sufficient thickness to be free-standing, with at least the substrate being heated to an epitaxial growth temperature; and selecting the coefficients of thermal expansion of the second and third materials to be different from each other by a thermal expansion differential, determined as a function of the epitaxial growth temperature or subsequent application of external mechanical stresses, such that, as the second assembly cools from the epitaxial growth temperature, stresses are induced in the bonding interface to facilitate detachment of the nucleation layer and the substrate from the support.

22. The method according to claim 21, wherein the third material has a band gap value above 1.5 eV.

* * * * *

UNITED STATES PATENT AND TRADEMARK OFFICE
CERTIFICATE OF CORRECTION

PATENT NO. : 7,407,869 B2  
APPLICATION NO. : 11/212795  
DATED : August 5, 2008  
INVENTOR(S) : Ghyselen et al.

Page 1 of 1

It is certified that error appears in the above-identified patent and that said Letters Patent is hereby corrected as shown below:

Title Page:
Item (56) References Cited, FOREIGN PATENT DOCUMENTS, change
"WO 99/471776 A1" to -- WO 99/41776 A1 --.
Item (57) ABSTRACT, line 7, after "a third material is grown, by" change "epitaph" to
-- epitaxy --.

Column 16
Line 39 (claim 11, line 1), change "tine" to -- fine --.

Signed and Sealed this

Seventh Day of October, 2008

JON W. DUDAS
*Director of the United States Patent and Trademark Office*